(12) United States Patent
Saito et al.

(10) Patent No.: US 11,800,253 B2
(45) Date of Patent: Oct. 24, 2023

(54) IMAGING DEVICE AND IMAGING SYSTEM

(71) Applicant: CANON KABUSHIKI KAISHA, Tokyo (JP)

(72) Inventors: Kazuhiro Saito, Tokyo (JP); Hideo Kobayashi, Tokyo (JP); Koichiro Iwata, Kanagawa (JP); Yoshiaki Takada, Kanagawa (JP); Satoshi Kato, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/241,297

(22) Filed: Apr. 27, 2021

(65) Prior Publication Data
US 2021/0360180 A1 Nov. 18, 2021

(30) Foreign Application Priority Data

May 15, 2020 (JP) ................. 2020-085603

(51) Int. Cl.
H04N 25/709 (2023.01)
H01L 27/146 (2006.01)
H04N 25/61 (2023.01)
H04N 25/67 (2023.01)

(52) U.S. Cl.
CPC ..... *H04N 25/709* (2023.01); *H01L 27/14603* (2013.01); *H01L 27/14623* (2013.01); *H04N 25/61* (2023.01); *H04N 25/67* (2023.01)

(58) Field of Classification Search
CPC .... H04N 5/3698; H04N 5/3572; H04N 5/365; H04N 5/361; H04N 5/36963; H04N 5/379; H04N 25/709; H04N 25/61; H04N 25/67; H04N 25/63; H04N 25/633; H04N 25/79; H01L 27/14603; H01L 27/14623; H01L 27/14643
See application file for complete search history.

(56) References Cited

U.S. PATENT DOCUMENTS

| 7,528,878 | B2 | 5/2009 | Sato |
| 7,741,593 | B2 | 6/2010 | Iwata |
| 7,817,199 | B2 | 10/2010 | Yamashita |
| 7,990,440 | B2 | 8/2011 | Kobayashi |

(Continued)

FOREIGN PATENT DOCUMENTS

| EP | 3614433 A1 | 2/2020 |
| JP | 2004-320346 A | 11/2004 |

(Continued)

OTHER PUBLICATIONS

U.S. Appl. No. 17/210,656, filed Mar. 24, 2021 by Takanori Suzuki et al.

(Continued)

*Primary Examiner* — Albert H Cutler
(74) *Attorney, Agent, or Firm* — VENABLE LLP

(57) ABSTRACT

An imaging device includes: a first pad portion that is connected to a voltage supply line in an aperture pixel region, and to which a reference voltage from outside of the semiconductor substrate is supplied; and a second pad portion that is connected to the voltage supply line in the light-shielded pixel region, and to which the reference voltage from outside of the semiconductor substrate is supplied, the second pad portion being separated from the first pad portion.

26 Claims, 8 Drawing Sheets

(56) References Cited

U.S. PATENT DOCUMENTS

| | | |
|---|---|---|
| 8,013,369 B2 | 9/2011 | Iwata |
| 8,081,245 B2 | 12/2011 | Itano |
| 8,084,729 B2 | 12/2011 | Kato |
| 8,154,639 B2 | 4/2012 | Kato |
| 8,159,577 B2 | 4/2012 | Iwata |
| 8,159,582 B2 | 4/2012 | Kato |
| 8,309,898 B2 | 11/2012 | Kato |
| 8,355,066 B2 | 1/2013 | Iwata |
| 8,368,790 B2 | 2/2013 | Itano |
| 8,415,724 B2 | 4/2013 | Iwata |
| 8,553,118 B2 | 10/2013 | Saito |
| 8,598,901 B2 | 12/2013 | Hiyama |
| 8,670,058 B2 | 3/2014 | Hayashi |
| 8,675,107 B2 | 3/2014 | Yamashita |
| 8,710,558 B2 | 4/2014 | Inoue |
| 8,711,259 B2 | 4/2014 | Maehashi |
| 8,835,828 B2 | 9/2014 | Kobayashi |
| 8,836,838 B2 | 9/2014 | Nakamura |
| 8,884,391 B2 | 11/2014 | Fudaba |
| 8,885,082 B2 | 11/2014 | Noda |
| 8,928,786 B2 | 1/2015 | Iwata |
| 9,029,752 B2 | 5/2015 | Saito |
| 9,083,906 B2 | 7/2015 | Nakamura |
| 9,118,857 B2 | 8/2015 | Iwata |
| 9,197,833 B2 | 11/2015 | Kato |
| 9,232,165 B2 | 1/2016 | Saito |
| 9,264,641 B2 | 2/2016 | Kobayashi |
| 9,267,840 B2 | 2/2016 | Kato |
| 9,270,914 B2 | 2/2016 | Kato |
| 9,305,954 B2 | 4/2016 | Kato |
| 9,337,222 B2 | 5/2016 | Saito |
| 9,357,122 B2 | 5/2016 | Kususaki |
| 9,407,847 B2 | 8/2016 | Maehashi |
| 9,426,391 B2 | 8/2016 | Takada |
| 9,432,607 B2 | 8/2016 | Morita |
| 9,438,828 B2 | 9/2016 | Itano |
| 9,509,931 B2 | 11/2016 | Kobayashi |
| 9,602,752 B2 | 3/2017 | Kobayashi |
| 9,602,753 B2 | 3/2017 | Saito |
| 9,627,423 B2 | 4/2017 | Takada |
| 9,716,823 B2 | 7/2017 | Iwata |
| 9,813,681 B2 | 11/2017 | Kato |
| 9,831,278 B2 | 11/2017 | Kato |
| 9,900,539 B2 | 2/2018 | Yamasaki |
| 9,966,395 B2 | 5/2018 | Kato |
| 10,015,430 B2 | 7/2018 | Kobayashi |
| 10,021,328 B2 | 7/2018 | Takada |
| 10,051,223 B2 | 8/2018 | Yamashita |
| 10,057,529 B2 | 8/2018 | Saito |
| 10,116,854 B2 | 10/2018 | Kato |
| 10,194,103 B2 | 1/2019 | Saito |
| 10,298,867 B2 | 5/2019 | Takada |
| 10,319,765 B2 | 6/2019 | Kato |
| 10,403,658 B2 | 9/2019 | Takada |
| 10,504,949 B2 | 12/2019 | Kobayashi |
| 10,609,316 B2 | 3/2020 | Kobayashi |
| 10,609,320 B2 | 3/2020 | Kuroda |
| 10,742,905 B2 | 8/2020 | Iwata |
| 10,778,920 B2 | 9/2020 | Yamashita |
| 2002/0153491 A1 | 10/2002 | Sugawara |
| 2004/0262492 A1* | 12/2004 | Matsuda ............ H01L 31/0232 257/E31.128 |
| 2007/0138375 A1* | 6/2007 | Lee ...................... H04N 5/3575 250/214 R |
| 2012/0175503 A1 | 7/2012 | Kuroda |
| 2012/0293698 A1 | 11/2012 | Sukegawa |
| 2013/0140440 A1 | 6/2013 | Kobayashi |
| 2013/0163068 A1 | 6/2013 | Matsuoka |
| 2013/0300780 A1 | 11/2013 | Ueki |
| 2015/0062367 A1 | 3/2015 | Inui |
| 2015/0122975 A1 | 5/2015 | Kazuhiro |
| 2015/0341582 A1* | 11/2015 | Sakaguchi ......... H04N 5/37457 348/301 |
| 2016/0227141 A1 | 8/2016 | Kobayashi |
| 2018/0098005 A1 | 4/2018 | Hanzawa |
| 2019/0166323 A1 | 5/2019 | Saito |
| 2020/0066772 A1 | 2/2020 | Kobayashi |
| 2020/0314360 A1 | 10/2020 | Sakai |
| 2020/0374481 A1 | 11/2020 | Yamashita |
| 2020/0378828 A1 | 12/2020 | Kobayashi |
| 2021/0021770 A1 | 1/2021 | Nakazawa |
| 2021/0021777 A1 | 1/2021 | Kobayashi |
| 2021/0021782 A1 | 1/2021 | Sato |
| 2021/0041305 A1* | 2/2021 | Kawazu ................ H04N 5/378 |
| 2021/0175275 A1* | 6/2021 | Fitzi ................... H04N 5/37455 |
| 2022/0139992 A1* | 5/2022 | Ito .......................... H04N 5/361 257/432 |

FOREIGN PATENT DOCUMENTS

| | | |
|---|---|---|
| JP | 2009-81443 A | 4/2009 |
| JP | 2009-206941 A | 9/2009 |
| JP | 2011-159958 A | 8/2011 |
| JP | 2013-98845 A | 5/2013 |
| JP | 2015-50706 A | 3/2015 |
| JP | 2015-50706 A1 | 3/2015 |
| WO | 2013/027626 A1 | 3/2013 |
| WO | 2016/158484 A1 | 10/2016 |

OTHER PUBLICATIONS

U.S. Appl. No. 17/242,486, filed Apr. 28, 2021 by Koichiro Iwata.

U.S. Appl. No. 17/333,305, filed May 28, 2021 by Hideo Kobayashi et al.

U.S. Appl. No. 17/242,040, filed Feb. 26, 2021 by Takehiko Soda et al.

Japanese Office Action dated Jun. 28, 2022 during prosecution of related Japanese Application No. 2020-085603 (English translation available).

Chinese Office Action dated Aug. 24, 2023, during prosecution of related Chinese Application No. 2021-10526970.5 (English translation included).

* cited by examiner

IMAGING DEVICE AND IMAGING SYSTEM

BACKGROUND OF THE INVENTION

Field of the Invention

The present invention relates to an imaging device and an imaging system.

Description of the Related Art

An imaging device including a pixel array having a plurality of pixels formed on a semiconductor substrate is used. Japanese Patent Application Laid-Open No. 2015-50706 describes an imaging device including a pad portion receiving reference voltage and a second power supply wiring pattern for connecting a first power supply wiring pattern to the pad portion extending to a pixel array. In order to facilitate shading correction processing, the imaging device disclosed in Japanese Patent Application Laid-Open No. 2015-50706 sets the resistance value of the second power supply wiring pattern lower than that of the first power supply wiring pattern.

SUMMARY OF THE INVENTION

According to an aspect of the present disclosure, there is provided an imaging device including a pixel array that includes a plurality of pixels arranged in a first direction and a second direction crossing the first direction on a semiconductor substrate, a plurality of signal lines, each of the plurality of the signal lines being connected to the plurality of pixels in the first direction, an aperture pixel region that includes the plurality of pixels outputting a pixel signal corresponding to incident light to the signal line, a light-shielded pixel region that includes the plurality of pixels which are light-shielded, and that is arranged in the second direction with respect to the aperture pixel region, a plurality of voltage supply lines that supply reference voltage to the plurality of pixels arranged in the first direction respectively, a first pad portion that is connected to the voltage supply line in the aperture pixel region, and to which the reference voltage from outside of the semiconductor substrate is supplied, and a second pad portion that is connected to the voltage supply line in the light-shielded pixel region, and to which the reference voltage from outside of the semiconductor substrate is supplied, the second pad portion being separated from the first pad portion.

According to another aspect of the present disclosure, there is provided an imaging device including a first semiconductor substrate that includes a pixel array having a plurality of pixels arranged in a first direction and a second direction, a second semiconductor substrate that includes a signal processing circuit processing a pixel signal from the pixel array, wherein the first semiconductor substrate comprises: a plurality of signal lines, each of the plurality of the signal lines being connected to the plurality of pixels in the first direction, an aperture pixel region that is arranged in the pixel array and that includes the plurality of pixels outputting a pixel signal corresponding to incident light to the signal line, a light-shielded pixel region that includes the plurality of pixels which are light-shielded, and that is arranged in the pixel array in the second direction with respect to the aperture pixel region, a plurality of voltage supply lines that supply a reference voltage with the plurality of pixels arranged in the first direction respectively, a first voltage supply portion that is connected to the voltage supply line in the aperture pixel region, and to which the reference voltage from the second semiconductor substrate is supplied, and a second voltage supply portion that is connected to the voltage supply line in the light-shielded pixel region, and to which the reference voltage from the second semiconductor substrate is supplied, the second voltage supply portion being separated from the first voltage supply portion.

Further features of the present invention will become apparent from the following description of exemplary embodiments with reference to the attached drawings.

DESCRIPTION OF THE EMBODIMENTS

The imaging device described in Japanese Patent Application Laid-Open No. 2015-50706 involves a problem that the image quality degrades due to the fluctuation of the reference voltage caused by the incident light.

The present invention has been made in view of the problems described above and relates to a technique to reduce the degradation of image quality due to the fluctuation of the reference voltage caused by the incident light.

Each embodiment will be described in detail below by using the drawings. In the description of each embodiment, the same components or corresponding components are labeled with same references, and the description thereof may be omitted or simplified.

First Embodiment

Figure 1:
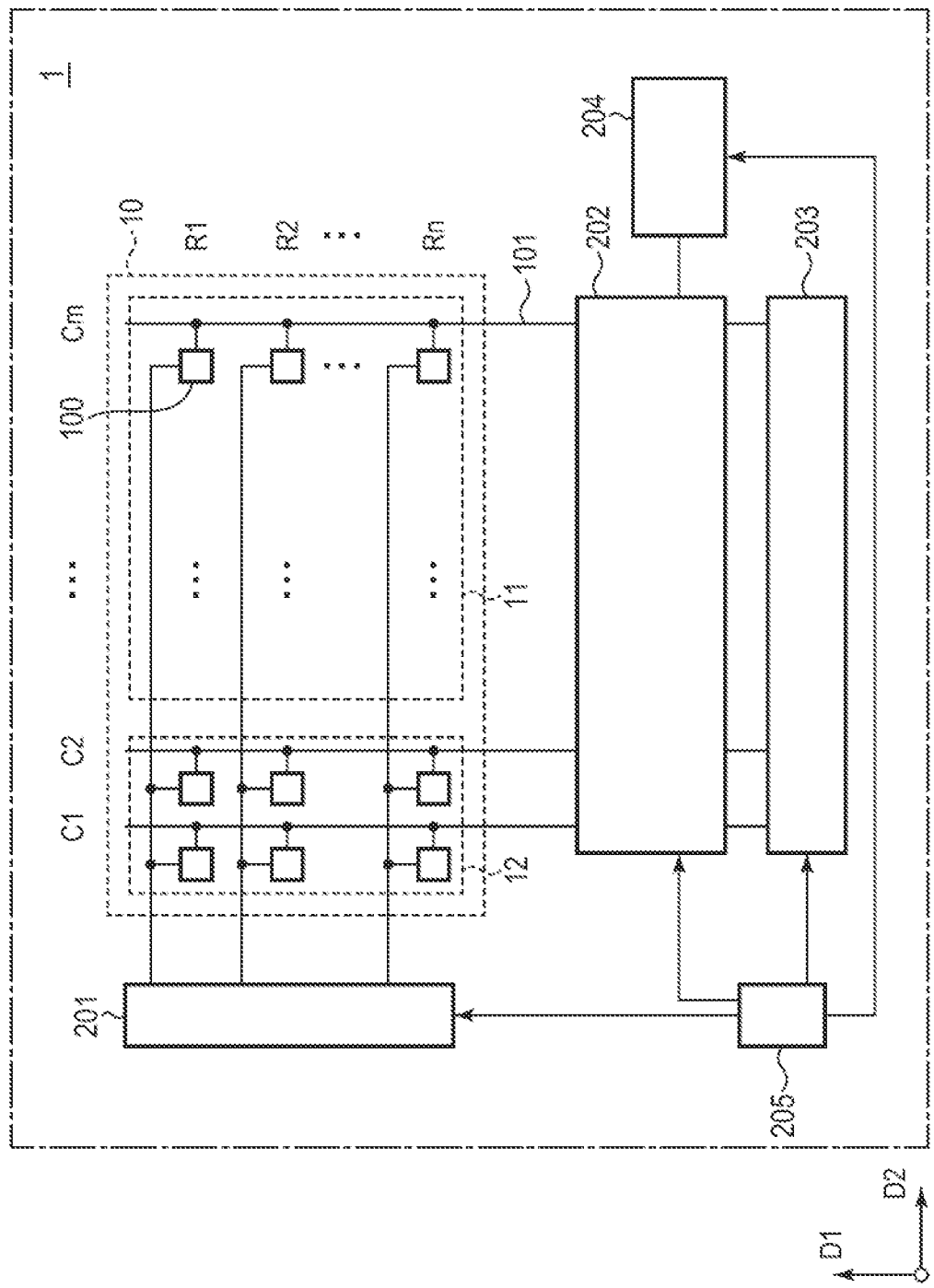
FIG. 1 is a block diagram of an imaging device according to a first embodiment of the present invention.

FIG. 1 is a block diagram of an imaging device according to the present embodiment. The imaging device is configured on a semiconductor substrate 1 and is a CMOS image sensor for example. A pixel array 10, a vertical scanning circuit 201, a column circuit 202, a horizontal scanning circuit 203, an output circuit 204, and a timing generation circuit 205 are formed on the semiconductor substrate 1.

The pixel array 10 is provided with a plurality of pixels 100 arranged in a matrix, and each pixel 100 is provided with a photoelectric conversion element for generating and accumulating signal charges based on incident light. Note that, in the present specification, the row direction indicates the horizontal direction in FIG. 1 (second direction D2), and the column direction indicates the vertical direction crossing the row direction D2 in FIG. 1 (first direction D1). In FIG. 1, pixels 100 in n rows and m columns of rows R1 to Rn and columns C1 to Cm are illustrated. A micro lens and a color filter may be arranged on the pixel 100. The color filter is, for example, primary-color filter of red, blue or green, and is provided on each pixel 100 accordance with the Bayer arrangement.

The pixel array 10 includes an aperture pixel region 11 and a light-shielded pixel region 12 in which a light-shielding film is formed. A light shielding film is not formed on the pixels 100 included in the aperture pixel region 11, and a pixel signal in accordance with incident light can be output. The light-shielded pixel region 12 is a horizontal optical black (HOB) pixel region arranged adjacent to the aperture pixel region 11 in the row direction D2. In FIG. 1, the light-shielded pixel region 12 is illustrated as a region including 2 columns (C1 and C2) and n rows (R1 to Rn). A dark signal corresponding to a noise component is obtained from the pixels 100 of the light-shielded pixel region 12.

Further, the pixel array 10 may be provided with a ranging row in which focus detection pixels for outputting pixel signals for focus detection are arranged, and a plurality of imaging rows in which imaging pixels for outputting pixel signals for generating images are arranged. Column signal lines 101 are connected to a plurality of pixels 100 of each column, and a plurality of pixels 100 of the same column sequentially output pixel signals to a common column signal line 101.

The vertical scanning circuit 201 comprises a shift register, a gate circuit, a buffer circuit, or the like, and outputs a control signal to the pixels 100 via the column signal line 101 based on a vertical synchronization signal, a horizontal synchronization signal, a clock signal, or the like, to drive the pixels 100 for each row.

The column circuit 202 is connected to each column signal line 101, amplifies the pixel signal on the column signal line 101, and performs Analogue to Digital (AD) conversion. The AD conversion unit of the column circuit 202 may comprise a comparator for comparing the reference signal and the pixel signal, a memory for holding the comparison result and the count signal, or the like.

The horizontal scanning circuit 203 includes a decoder and a shift register, sequentially reads the count value held in the memory of the column circuit 202 as a digital signal, and outputs the digital signal to a signal processing unit provided inside or outside the chip (imaging device). The signal processing unit is provided with a digital signal processor and performs digital signal processing such as digital gain, digital correlation double sampling, digital offset and linearity correction.

The output circuit 204 is provided with a serial output circuit of Low Voltage Differential Signaling (LVDS) format, and outputs the signal processed digital signal to the outside of the solid-state imaging device at high speed and low power consumption.

The timing generation circuit 205 generates various control signals and drive signals based on the clock and the synchronization signal, and the timing generation circuit 205 controls the vertical scanning circuit 201, the column circuit 202, the horizontal scanning circuit 203, and the output circuit 204. Further, the timing generation circuit 205 may include a reference signal output circuit for generating a reference signal (lamp signal) whose voltage varies with time, and a counter circuit for generating a count signal synchronized with the reference signal. The counter circuit starts counting at the same time as the change of the voltage of the reference signal and supplies the count signal to the column circuit 202. The column circuit 202 holds the count signal in the memory at the timing when the relationship between the pixel signal and the reference signal is inverted, and can output the count signal as a digital signal after AD conversion.

In the imaging device configured as described above, the dark signal obtained from each row of the light-shielded pixel region 12 is used as correction data of the pixel signal obtained from the aperture pixel region 11 of the row. For example, a signal obtained by subtracting the dark signal from the pixel signal is output as a corrected signal. The correction processing using the dark signal may be performed by a signal processing unit inside the imaging device, or may be performed by a circuit outside the imaging device.

Figure 2:
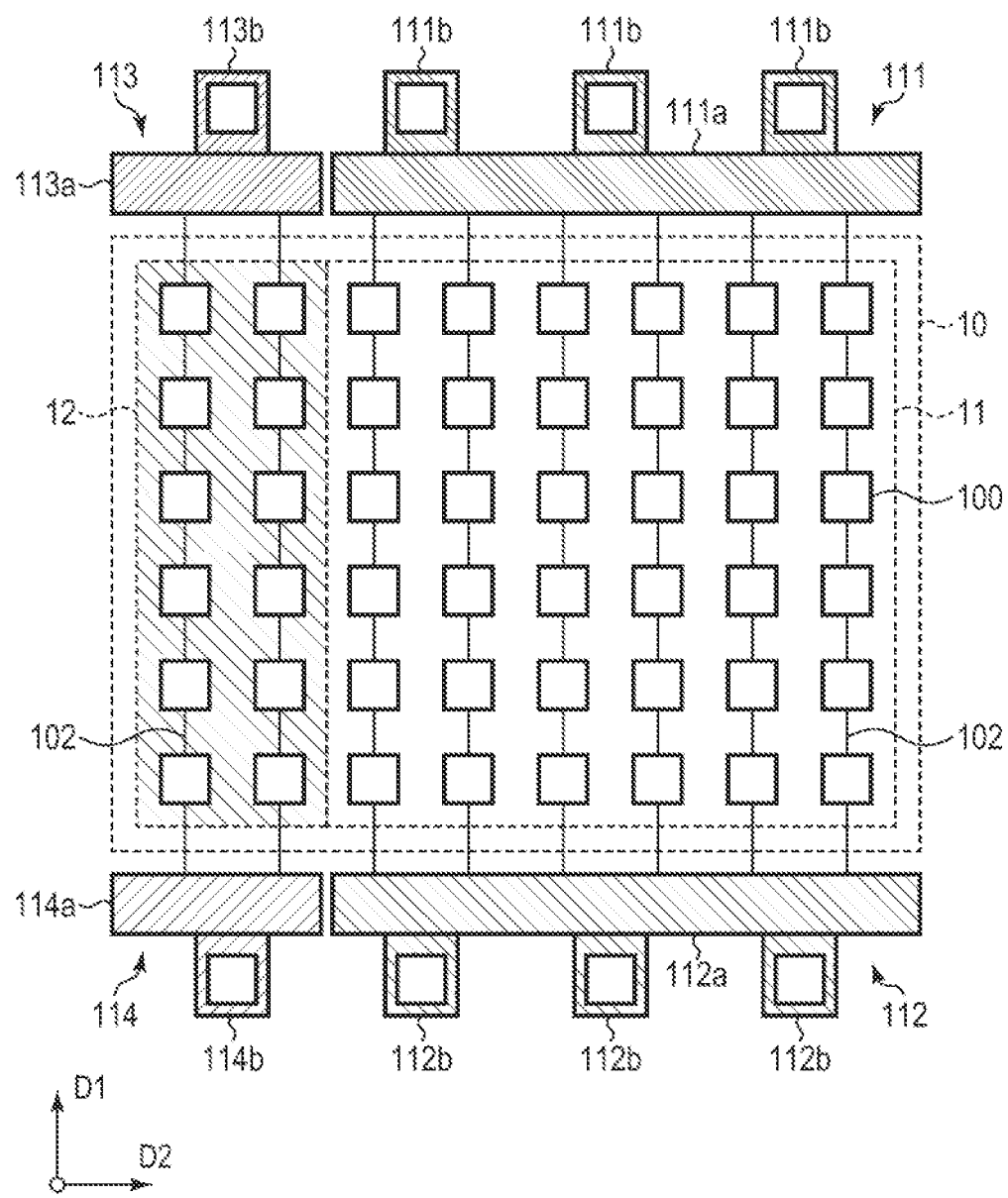
FIG. 2 is a schematic diagram of an imaging device according to the first embodiment of the present invention.

FIG. 2 is a schematic diagram of the imaging device according to the present embodiment, and is a diagram for explaining the arrangement of the pixel array 10 and the wiring pattern. In order to simplify the description, it is assumed that the pixel array 10 includes six rows and eight columns of the pixels 100, and that the pixel array 10 includes an aperture pixel region 11 having six rows and six columns of the pixels 100 and a light-shielded pixel region 12 having six rows and two columns of the pixels 100. The light-shielding film made of a metal material such as copper or aluminum is formed in the light-shielded pixel region 12. A plurality of the pixels 100 in each column are connected to a voltage supply line 102. The voltage supply line 102 may be made of a metal material such as copper or aluminum. The voltage supplied from the voltage supply line 102 to the pixels 100 may be, for example, various reference voltages such as a power supply voltage, a voltage of a semiconductor well region, or the like. Although FIG. 2 illustrates a voltage supply line 102 in each column, a plurality of voltage supply lines 102 may be provided corresponding to a plurality of reference voltages.

On the upper and lower sides of the pixel array 10 in the column direction D1, first pad portions 111 and 112, and second pad portions 113 and 114 are arranged. The pair of first pad portions 111 and 112 are connected to both ends of the plurality of voltage supply lines 102 of the aperture pixel region 11, and supply a reference voltage from the outside of the semiconductor substrate to the pixels 100 of the aperture pixel region 11. The pair of second pad portions 113 and 114 are connected to both ends of the plurality of voltage supply lines 102 of the light-shielded pixel region 12, and the pair of second pad portions 113 and 114 supply a reference voltage from the outside of the semiconductor substrate to the pixels 100 of the light-shielded pixel region 12.

The first pad portion 111 includes a first wiring pattern 111a and a plurality of first bonding pads 111b. The first wiring pattern 111a has a predetermined width in the column direction D1, and the first wiring pattern 111a extends in the row direction D2. In FIG. 2, the length of the first wiring pattern 111a in the row direction D2 is substantially equal to the length of the aperture pixel region 11 in the row direction D2, but this is not necessarily the case. The first wiring pattern 111a is connected to one ends of the plurality of voltage supply lines 102 of the aperture pixel region 11. The first wiring pattern 111a and the voltage supply line 102 may be integrally formed in the same wiring layer or may be formed in different wiring layers. At least a first bonding pad 111b is connected to the first wiring pattern 111a. The first bonding pad 111b is formed so as to extend from the first wiring pattern 111a in the column direction D1 in a planar view. Although FIG. 2 illustrates three of first bonding pads 111b, the number of first bonding pads 111b is not limited.

The first pad portion 112 is configured symmetrically with the first pad portion 111, and the first pad portion 112 includes a first wiring pattern 112a and first bonding pads 112b. It is preferable that the width and length of the first wiring pattern 112a are substantially equal to the width and length of the first wiring pattern 111a, but this is not necessarily the case. The first wiring pattern 112a is connected to the other ends of the plurality of voltage supply lines 102 of the aperture pixel region 11, and the reference voltage from the first bonding pads 112b is supplied to the pixels 100 of the aperture pixel region 11. The number and shape of the first bonding pads 112b preferably correspond to the number and shape of the first bonding pads 111b.

The second pad portion 113 includes a second wiring pattern 113a and a second bonding pad 113b. The second wiring pattern 113a extends in the row direction D2 in the same manner as the first wiring pattern 111a. In FIG. 2, the length of the second wiring pattern 113a in the row direction may be formed to be substantially equal to the length of the light-shielded pixel region 12 in the row direction D2. The width of the second wiring pattern 113a in the column direction D1 is substantially equal to the width of the first wiring pattern 111a in the column direction D1, but this is not necessarily the case. The second wiring pattern 113a is a pattern different from the first wiring pattern 111a and formed separately from the first wiring pattern 111a. That is, in a planar view, a gap is formed between the first wiring pattern 111a and the second wiring pattern 113a. Further, the first wiring pattern 111a and the second wiring pattern 113a may be formed in the same wiring layer or in different wiring layers. When the first wiring pattern 111a and the second wiring pattern 113a are formed in different wiring layers, it is permissible to overlap the first wiring pattern 111a and the second wiring pattern 113a each other in a planar view.

The second wiring pattern 113a is connected to the second bonding pad 113b. In FIG. 2, a second bonding pad 113b is illustrated, but the number of second bonding pads 113b may be a plural. The second wiring pattern 113a is connected to one end of the voltage supply line 102 of the light-shielded pixel region 12, and the reference voltage from the second bonding pad 113b is supplied to the pixels 100 in the light-shielded pixel region 12.

The second pad portion 114 is configured symmetrically with the second pad portion 113, and the second pad portion 114 includes a second wiring pattern 114a and a second bonding pad 114b. It is preferable that the width and length of the second wiring pattern 114a are substantially equal to the width and length of the first wiring pattern 112a, but this is not necessarily the case. The second wiring pattern 114a is connected to the other ends of the plurality of voltage supply lines 102 in the light-shielded pixel region 12, and the reference voltage from the second bonding pad 114b is supplied to the pixels 100 in the light-shielded pixel region 12. The number and shape of the second bonding pads 114b preferably correspond to the number and shape of the second bonding pads 113b.

Figure 3:
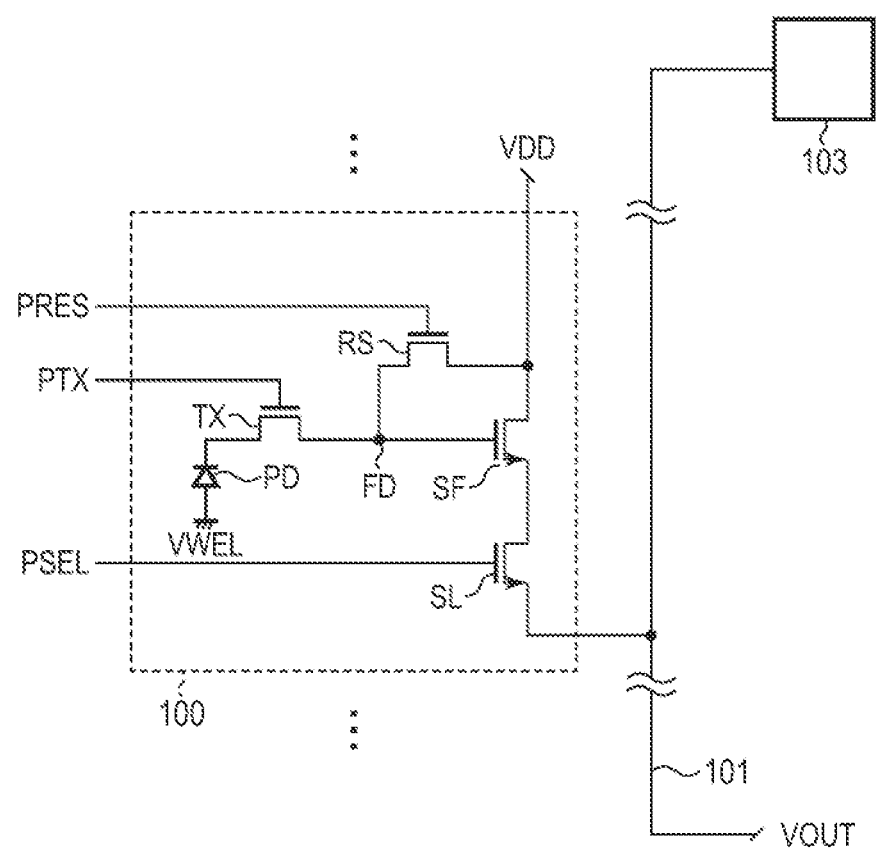
FIG. 3 is an equivalent circuit diagram of a pixel according to the first embodiment of the present invention.

FIG. 3 is an equivalent circuit diagram of a pixel in the present embodiment. The pixel 100 may include a photoelectric conversion element PD, a transfer transistor TX, a floating diffusion FD, a reset transistor RS, a source follower transistor SF, and a select transistor SL. In the following description, it is assumed that the transistor is an N-type Metal Oxide Semiconductor (MOS) transistor unless otherwise specified. The back gate terminal (not illustrated) is supplied with a reference voltage (ground voltage) VWEL (0 [V] for example). The reset transistor RS and the source follower transistor SF are connected to a reference voltage (power supply voltage) VDD (3 [V] for example). The reference voltages VDD and VWEL may be supplied from the voltage supply line 102. A P-type MOS transistor may be used instead of the N-type MOS transistor. In this case, the voltage of the control signal applied to the P-type MOS transistor is inverted with respect to the voltage of the control signal in the N-type MOS transistor.

The photoelectric conversion element PD is a photodiode, for example, and the photoelectric conversion element PD performs photoelectric conversion and charge accumulation by incident light. Note that, instead of the photodiode, a configuration for generating a photoelectric effect such as a photoelectric conversion film made of an organic material or a photogate may be used. The number of photoelectric conversion elements PD per pixel 100 is not limited, and two, four or more photoelectric conversion elements PD may be provided so as to share a micro lens. Further, dark current noise can be reduced by constituting a buried photodiode type. The photoelectric conversion element PD is provided with a micro lens, and light condensed by the micro lens is incident on the photoelectric conversion element PD.

The transfer transistor TX is provided corresponding to the photoelectric conversion element PD, and a control signal PTX is applied to the gate terminal of the transfer transistor TX. When the control signal PTX is activated, the charge generated and accumulated by the light reception in the photoelectric conversion element PD is transferred to the floating diffusion FD via the transfer transistor TX.

A reference voltage VDD is applied to the drain terminal of the source follower transistor SF. The source voltage of the source follower transistor SF changes in accordance with changes in the amount of charge transferred to the floating diffusion FD.

The selection transistor SL is provided between the source follower transistor SF and the column signal line 101. The selection transistors SL of the pixels 100 in a plurality of rows are connected to a common column signal line 101, and a common constant current source 103 and each source follower transistor SF configure a source follower circuit. A control signal PSEL is applied to the gate terminal of the selection transistor SL. When the control signal PSEL is activated, the select transistor SL may output the output VOUT corresponding to the source voltage of the source follower transistor SF to the column signal line 101.

The source of the reset transistor RS is connected to the floating diffusion FD, and the reference voltage VDD is applied to the drain terminal. A control signal PRES is applied to the gate terminal of the reset transistor RS. When the control signal PRES is activated, the reset transistor RS may reset the voltage of the floating diffusion FD.

The column signal line 101 is electrically connected to the constant current source 103, and the constant current source 103 supplies a constant bias current to the source terminal of the source follower transistor SF via the column signal line 101.

When the pixels 100 in the aperture pixel region 11 are irradiated with strong incident light, the voltage of the column signal line 101 is significantly lowered, the circuit operation range of the constant current source 103 is narrowed, and the current from the constant current source 103 may be cut off. In this case, via the voltage supply line 102 such as the reference voltage VDD, the reference voltage VDD of the reference voltage supply line pattern in the light-shielded pixel region 12 fluctuates, and the dark signal may fluctuate depending on the incident light. When the dark signal fluctuates depending on the incident light, image quality degradation such as smear may occur in correction processing using the dark signal. Therefore, it is desirable that the dark signal obtained from the light-shielded pixel region 12 has a characteristic independent of incident light. As illustrated in FIG. 2, in the present embodiment, the first pad portions 111 and 112 in the aperture pixel region 11 and the second pad portions 113 and 114 in the light-shielded pixel region 12 are configured differently. That is, the first pad portion 111 and the second pad portion 113 adjacent to the row direction D2 are separated from each other, and similarly, the first pad portion 112 and the second pad portion 114 adjacent to in the row direction D2 are separated from each other. Thus, even if strong incident light is irradiated and the voltage of the first pad portions 111 and 112 in the aperture pixel region 11 fluctuates, the voltage fluctuation of the second pad portions 113 and 114 in the light-shielded pixel region 12 is suppressed by a regulator circuit, a bypass capacitor, or the like outside the semiconductor substrate. As a result, a stable dark signal unaffected by incident light can be obtained from the light-shielded pixel region 12, and correction processing with higher accuracy can be performed.

In the above description, the reference voltage supplied to the voltage supply line 102 is reference voltage (power supply voltage) VDD of the pixels 100, but the reference voltage may be reference voltage (ground voltage) VWEL of the pixels 100. Further, while six rows and eight columns of pixel array 10 are illustrated as an example, the actual pixel array 10 may include thousands of rows and thousands of columns of pixels 100, and the light-shielded pixel region 12 may also include hundreds of columns of pixels. In this case, the light-shielded pixel region 12 may be provided with the aperture pixel region of about several tens of columns. Since a stable dark signal is obtained as a whole in the light-shielded pixel region 12 including a large number of the pixels 100, correction processing with high accuracy can be realized.

Second Embodiment

Figure 4:
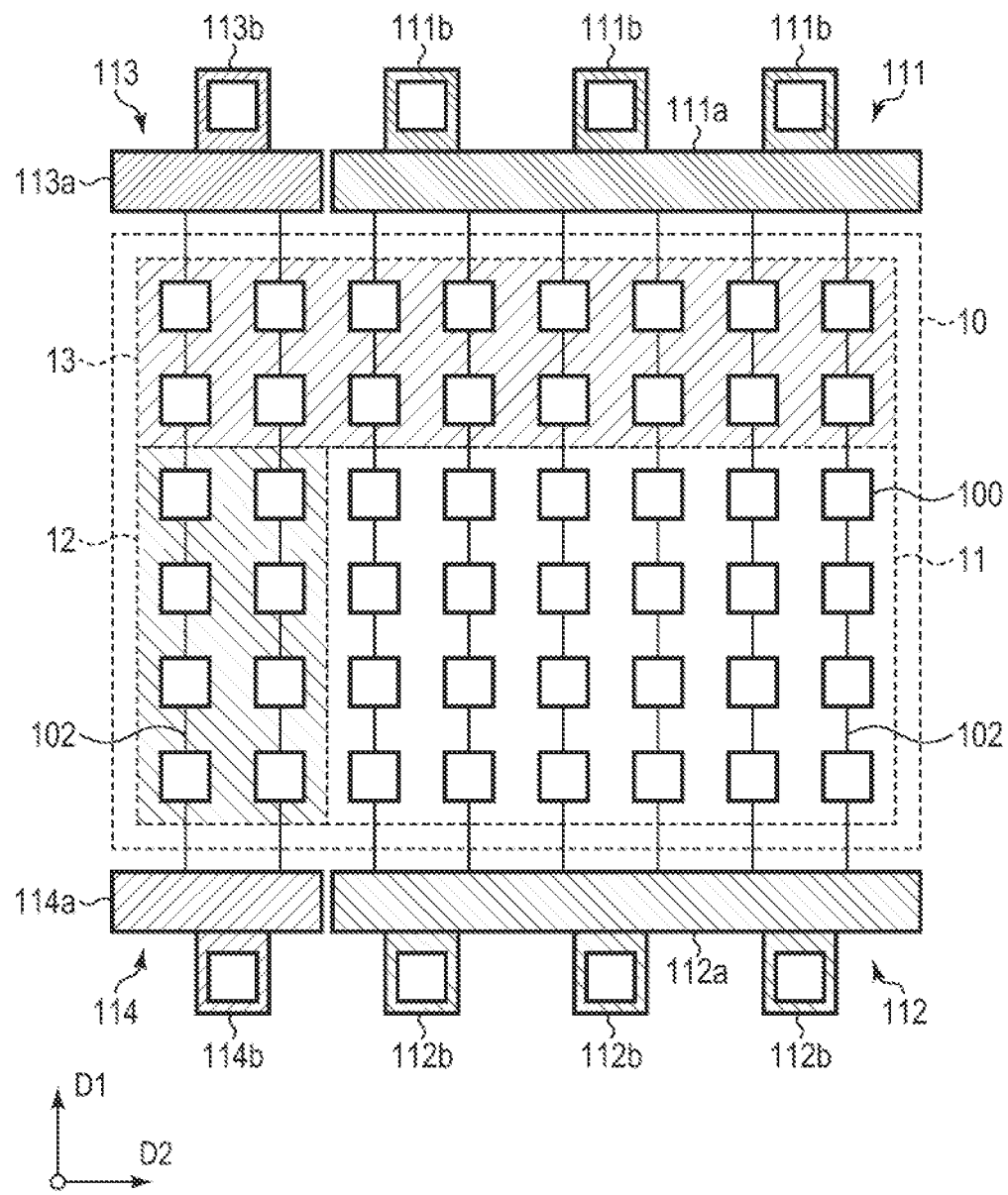
FIG. 4 is a schematic diagram of an imaging device according to a second embodiment of the present invention.

FIG. 4 is a schematic diagram of an imaging device according to the present embodiment. The pixel array 10 of the imaging device of the present embodiment includes a vertical optical black (VOB) light-shielded pixel region 13. The imaging device according to the present embodiment will be described below mainly for a configuration different from the first embodiment.

In order to simplify the description, it is assumed that the pixel array 10 includes an aperture pixel region 11 having four rows and six columns of the pixels 100, a light-shielded pixel region 12 having four rows and two columns of the pixels 100, and a light-shielded pixel region 13 having two rows and eight columns of the pixels 100. In the light-shielded pixel region 13, a light-shielding film made of a metal material such as copper or aluminum is formed in the same manner as in the case of the light-shielding pixel region 12.

Also in the present embodiment, the first pad portions 111 and 112 in the aperture pixel region 11, and the second pad portions 113 and 114 in the light-shielded pixel region 12 are configured differently. The first pad portion 111 and the second pad portion 113 are separated from each other, and the first pad portion 112 and the second pad portion 114 are separated from each other. Therefore, even if strong incident light is irradiated and the voltage of the first pad portions 111 and 112 in the aperture pixel region 11 fluctuates, the voltage fluctuation of the second pad portions 113 and 114 in the light-shielded pixel region 12 is suppressed. As a result, a stable dark signal unaffected by incident light is obtained from the light-shielded pixel region 12, and correction processing with higher accuracy can be performed.

Further, in the present embodiment, the light-shielded pixel region 13 is arranged over the first to eighth columns. Therefore, when there is a difference in the characteristics at dark between the aperture pixel region 11 in the third to eighth columns and the light-shielded pixel region 12 in the first to second columns, the dark signal obtained from the light-shielded pixel region 13 may be used as reference data for correction processing. Therefore, more accurate correction processing can be performed.

Third Embodiment

Figure 5:
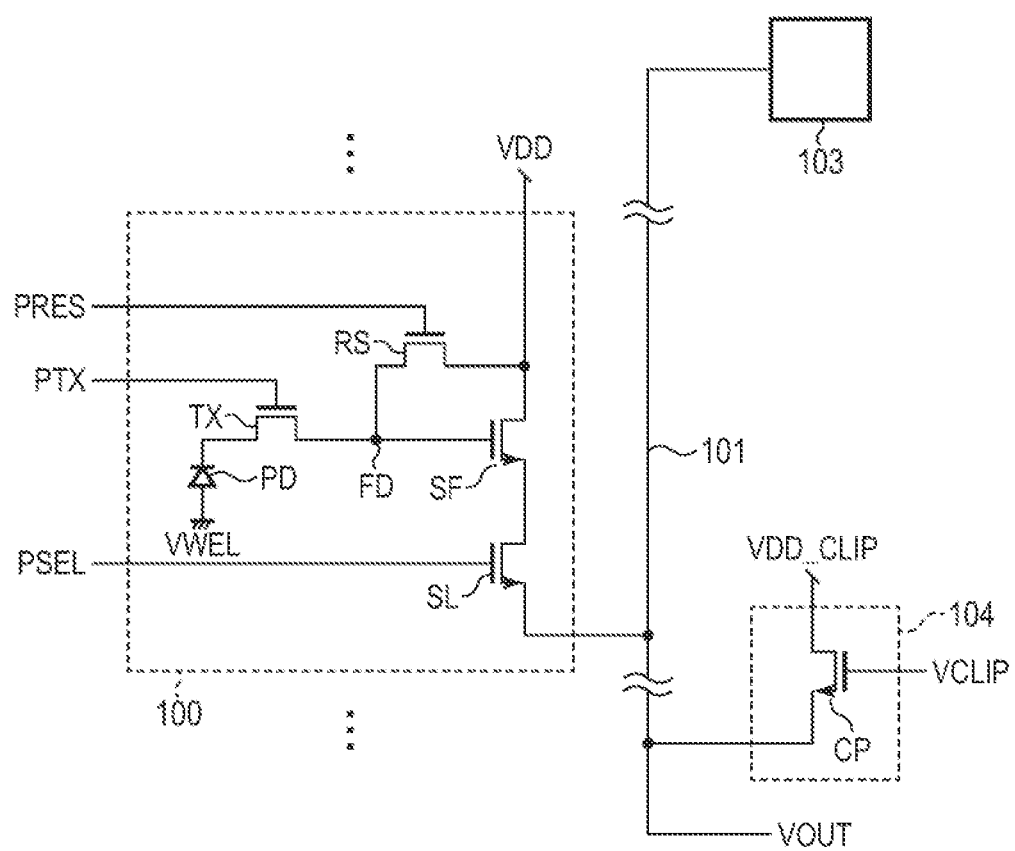
FIG. 5 is an equivalent circuit diagram of a pixel according to a third embodiment of the present invention.

FIG. 5 is an equivalent circuit diagram of a pixel in the present embodiment. The imaging device according to the present embodiment includes a clip circuit 104 for restricting a pixel signal on the column signal line 101. The imaging device according to the present embodiment will be described below mainly for a configuration different from the first or second embodiment.

In FIG. 5, the column signal line 101 is connected to a clip circuit 104. The clip circuit 104 includes a N-type MOS clip transistor CP. A reference voltage VCLIP is applied to the gate of the clip transistor CP, and a reference voltage VDD_CLIP is applied to the drain. The source is connected to the column signal line 101. For example, the reference voltage VDD_CLIP may be the same voltage as the reference voltage VDD that is supplied to the pixels 100 (3 [V] for example). The reference voltage VCLIP is preferably set to a voltage that does not narrow the circuit operating range of the constant current source 103 when irradiated with strong incident light. When the irradiation light has an intensity from a low luminance to an appropriate luminance, current flows to the constant current source 103 from the line of the reference voltage VDD that is supplied to the pixels 100. In the case of strong irradiation light, as current flows from the reference voltage VDD_CLIP to the constant current source 103, interruption of the current of the constant current source 103 can be prevented. However, when the current path changes, the reference voltage VDD in the pixels 100 in the aperture pixel region 11 may fluctuate. As described above, the fluctuation of the reference voltage VDD in the aperture pixel region 11 affects the reference voltage VDD in the light-shielded pixel region 12 and causes degradation of image quality in the correction process.

Also in the present embodiment, as illustrated in FIG. 2 and FIG. 4, the first pad portions 111 and 112 in the aperture pixel region 11, and the second pad portions 113 and 114 of the light-shielded pixel region 12 are configured differently and are separated from each other. Therefore, even if strong incident light is irradiated and the voltage of the first pad portions 111 and 112 of the aperture pixel region 11 fluctuates, the voltage fluctuation of the reference voltage VDD of the second pad portions 113 and 114 of the light-shielded pixel region 12 is suppressed. As a result, a stable dark signal unaffected by incident light is obtained from the light-shielded pixel region 12, and correction processing with higher accuracy can be performed.

Further, the reference voltage VDD_CLIP may be supplied from other pad portions separated from each other in each of the aperture pixel region 11 and the light-shielded pixel region 12. The pad portion for the reference voltage VDD_CLIP may be configured in the same manner as in the case of the first pad portions 111 and 112 and the second pad portions 113 and 114 for the reference voltage VDD. With such a configuration, fluctuation of the reference voltage VDD_CLIP is reduced, and more suitable operation can be realized.

Fourth Embodiment

Figure 6:
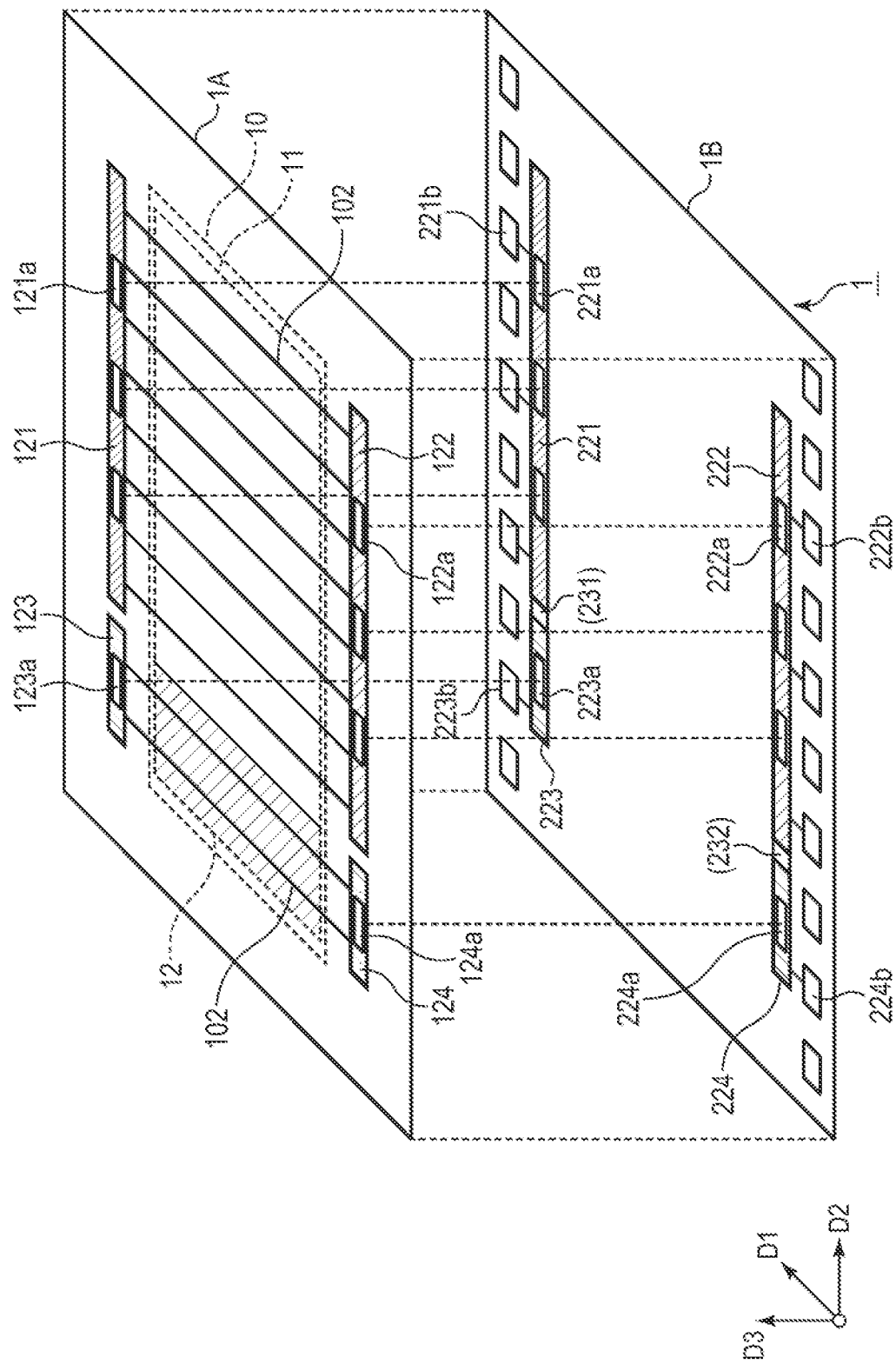
FIG. 6 is a schematic diagram of an imaging device according to a fourth embodiment of the present invention.

FIG. 6 is a schematic diagram of an imaging device according to the present embodiment. The imaging device according to the present embodiment will described below mainly for a configuration different from the first to third embodiment.

The imaging device according to the present embodiment includes a first semiconductor substrate 1A and a second semiconductor substrate 1B stacked to each other. The first semiconductor substrate 1A and the second semiconductor substrate 1B have substantially the same outer edges in a planar view. A pixel array 10 is arranged on the first semiconductor substrate 1A, and a signal processing circuit other than the pixel array 10 is arranged on the second semiconductor substrate 1B. The signal processing circuit may include, for example, the vertical scanning circuit 201, the column circuit 202, the horizontal scanning circuit 203, the output circuit 204, and the timing generation circuit 205 illustrated in FIG. 1, the constant current source 103 and the clip circuit 104 illustrated in FIG. 5.

In the first semiconductor substrate 1A, a pixel array 10 includes an aperture pixel region 11 and a light-shielded pixel region 12 in which a light-shielding film is formed and which is arranged adjacent in the row direction to the aperture pixel region 11. The pixels in each column of the pixel array 10 are connected to a voltage supply line 102 for supplying a reference voltage, and the plurality of voltage supply lines 102 in the aperture pixel region 11 are connected to first wiring patterns (first voltage supply portions) 121 and 122. That is, the first wiring pattern 121 is connected to one end of each of the plurality of voltage supply lines 102 in the aperture pixel region 11, and the first wiring pattern 122 is connected to the other end of each of the plurality of voltage supply lines 102 in the aperture pixel region 11. In the light-shielded pixel region 12, a plurality of voltage supply lines 102 are connected to second wiring patterns (second voltage supply portions) 123 and 124. That is, the second wiring pattern 123 is connected to one end of each of the plurality of voltage supply lines 102 in the light-shielded pixel region 12, and the second wiring pattern 124 is connected to the other end of each of the plurality of voltage supply lines 102 in the light-shielded pixel region 12. The first wiring pattern 121 and the second wiring pattern 123 adjacent in the row direction D2 are configured differently and separated from each other. Similarly, the first wiring pattern 122 and the second wiring pattern 124 adjacent to the row direction D2 are configured differently and separated from each other. The first wiring patterns 121 and 122, and the second wiring patterns 123 and 124 may be formed in the same wiring layer or in different wiring layers. The first wiring patterns 121 and 122 are provided with first substrate connecting portions 121a and 122a and the second wiring patterns 123 and 124 are provided with second substrate connecting portions 123a and 124a.

The second semiconductor substrate 1B is provided with third wiring patterns (third voltage supply portions) 221 and 222, fourth wiring patterns (fourth voltage supply portions) 223 and 224, third bonding pads 221b and 222b, and fourth bonding pads 223b and 224b. The third wiring patterns 221 and 222 are arranged corresponding to the first wiring patterns 121 and 122, and the fourth wiring patterns 223 and 224 are arranged corresponding to the second wiring patterns 123 and 124.

The third wiring pattern 221 may have a shape and a size corresponding to the first wiring pattern 121. At least a part of the third wiring pattern 221 may be overlapped on the first wiring pattern 121 in a planar view. The third wiring pattern 221 is provided with a plurality of third substrate connection portions 221a. When the first semiconductor substrate 1A and the second semiconductor substrate 1B are bonded to each other, the third substrate connecting portion 221a abuts on the first substrate connecting portion 121a, and the first wiring pattern 121 and the third wiring pattern 221 are electrically connected to each other. The third wiring pattern 221 is connected to the plurality of third bonding pads 221b. Similarly, the third wiring pattern 222 is arranged corresponding to the first wiring pattern 122 on the second semiconductor substrate 1B. The plurality of third substrate connection portions 222a provided on the third wiring pattern 222 are connected to the first substrate connection portions 122a of the first wiring pattern 122. The third wiring pattern 222 is connected to the plurality of third bonding pads 222b.

The fourth wiring patterns 223 and 224 may have a shape and a size corresponding to the second wiring patterns 123 and 124. The fourth wiring patterns 223 and 224 may be arranged at least partially overlapping the second wiring patterns 123 and 124 in a planar view. In the present embodiment, the fourth wiring pattern 223 is connected to the third wiring pattern 221, and the fourth wiring pattern 224 is connected to the third wiring pattern 222. The third wiring patterns 221 and 222 and the fourth wiring patterns 223 and 224 may be formed continuously in the same wiring layer. The fourth substrate connecting portions 223a and 224a of the fourth wiring patterns 223 and 224 are connected to the second substrate connecting portions 123a and 124a of the second wiring patterns 123 and 124, respectively. The fourth wiring patterns 223 and 224 are connected to the fourth bonding pads 223b and 224b, respectively.

In the imaging device configured as described above, the reference voltages from the outside of the imaging device are supplied to the third bonding pads 221b and 222b, and to the fourth bonding pads 223b and 224b. The reference voltages are further supplied from the second semiconductor substrate 1B to the first semiconductor substrate 1A. That is, the reference voltages are supplied to the first wiring patterns 121 and 122, and to the second wiring patterns 123 and 124, via the third wiring patterns 221 and 222, the fourth wiring patterns 223 and 224, the third substrate connecting portions 221a and 222a, the fourth substrate connecting portions 223a and 224a, the first substrate connecting portions 121a and 122a, and the second substrate connecting portions 123a and 124a, respectively. In the aperture pixel region 11, the reference voltage is supplied from the first wiring patterns 121 and 122 via the voltage supply line 102 to the pixels 100. In the light-shielded pixel region 12, the reference voltage is supplied from the second wiring patterns 123 and 124 via the voltage supply line 102 to the pixels 100. In the first semiconductor substrate 1A, the first wiring patterns 121 and 122, and the second wiring patterns 123 and 124 are separated. Therefore, even if strong incident light is irradiated and the voltage of the first wiring patterns 121 and 122 in the aperture pixel region 11 fluctuates, the voltage fluctuation of the second wiring patterns 123 and 124 in the light-shielded pixel region 12 is suppressed. As a result, a stable dark signal unaffected by incident light is obtained from the light-shielded pixel region 12, and correction processing with higher accuracy can be performed.

In the second semiconductor substrate 1B, the third wiring patterns 221 and 222 and the fourth wiring patterns 223 and 224 may be separated. That is, a gap 231 may be formed between the third wiring pattern 221 and the fourth wiring pattern 223, and a gap 232 may be formed between the third wiring pattern 222 and the fourth wiring pattern 224. In this case, the reference voltage fluctuation in the light-shielded pixel region 12 can be further suppressed, and the accuracy of the correction processing can be enhanced. In contrast, when the gaps 231 and 232 are not formed, the number of bonding pads can be reduced. That is, bonding pads can be shared between the third wiring pattern 221 and the fourth wiring pattern 223, and the number of bonding pads can be reduced. Therefore, when the number of bonding pads is limited, the above-described configuration is effective.

The number and position of the third bonding pads 221b and 222b and the fourth bonding pads 223b and 224b are not limited to the example illustrated in FIG. 6. In a planar view, an opening may be formed at a position of the first semiconductor substrate 1A corresponding to the third bonding pads 221a and 222a and the fourth bonding pads 223a and 224a. The first semiconductor substrate 1A may be provided with bonding pads to connect the third bonding pads 221b and 222b, the fourth bonding pads 223b and 224b to the second semiconductor substrate 1B with Though Silicon Via (TSV).

Fifth Embodiment

Figure 7:
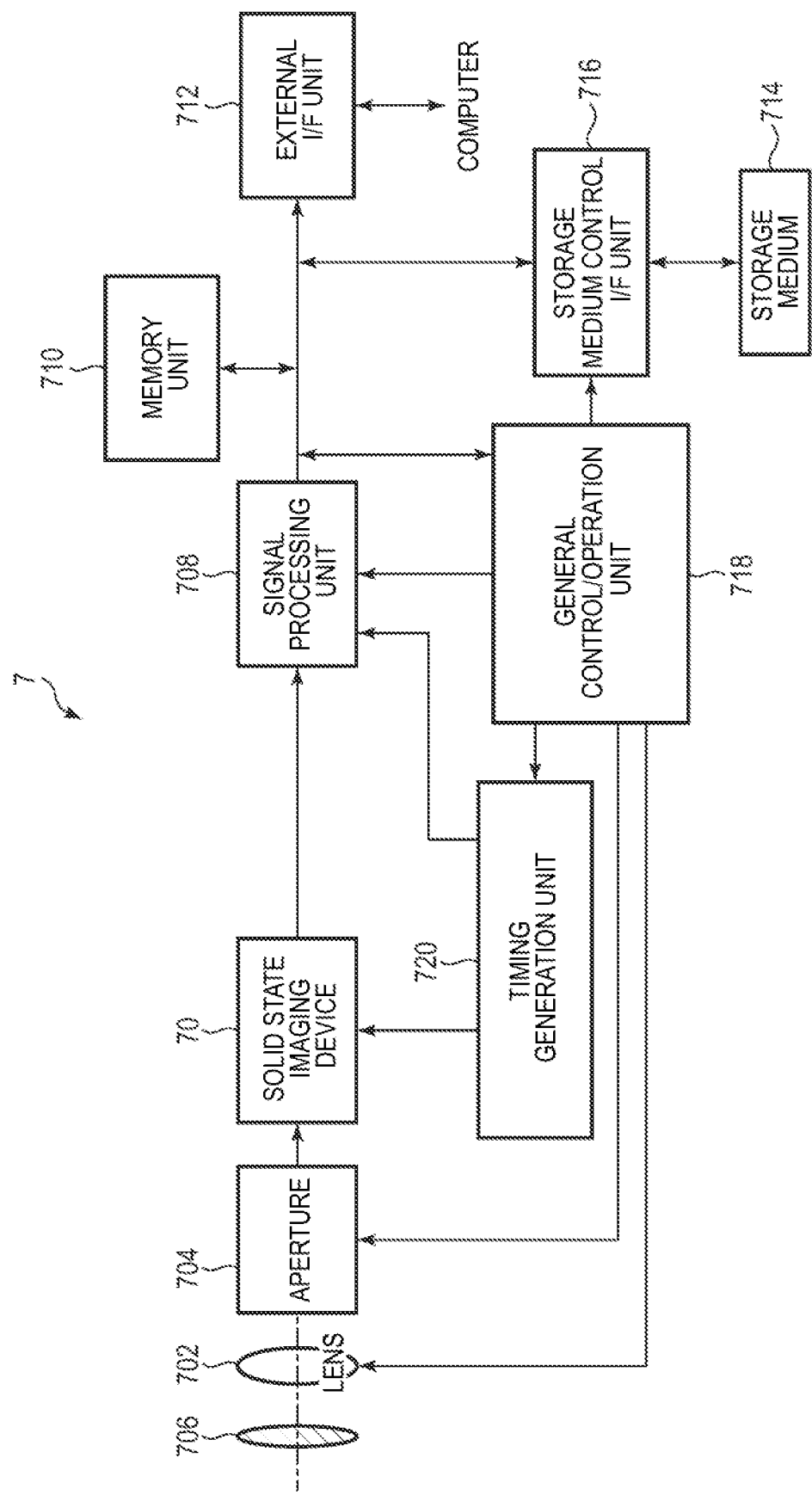
FIG. 7 is a block diagram of an imaging system according to a fifth embodiment of the present invention.

An imaging system according to the fifth embodiment of the present disclosure will be described with reference to FIG. 7. FIG. 7 is a block diagram illustrating a schematic configuration of the imaging system according to the present embodiment.

The imaging device described above-described embodiment can be applied to various imaging systems. Examples of imaging system may include digital still cameras, digital camcorders, headcams, copiers, fax machines, mobile phones, in-vehicle cameras, observation satellites, surveillance cameras or the like. FIG. 7 illustrates a block diagram of a digital still camera as example of the imaging system.

The imaging system 7 illustrated in FIG. 7 includes a barrier 706, a lens 702, an aperture 704, an imaging device 70, a signal processing unit 708, a timing generation unit 720, a general control/operation unit 718, a memory unit 710, storage medium control I/F unit 716, a storage medium 714, and an external I/F unit 712. The barrier 706 protects the lens 702 and the lens 702 captures an optical image of an object onto the imaging device 70. The aperture 704 changes a light amount passing through the lens 702. The imaging device 70 is configured as in the above-described embodiment, and converts the optical image captured by the lens 702 into image data (image signal). Assume that the semiconductor substrate of the imaging device 70 is provided with an AD (analog digital) conversion unit. A signal processing unit 708 compresses various correction data of the imaging data outputted from the imaging device 70.

The timing generation unit 720 outputs various timing signals to an imaging device 70 and a signal processing unit 708. The general control/operation unit 718 controls the entire digital still camera, and the memory unit 710 temporarily stores image data. The storage medium control I/F unit 716 is an interface for recording or reading image data on or from the storage medium 714, and the storage medium 714 is a removable storage medium such as a semiconductor memory for recording or reading image data. The external I/F unit 712 is an interface for communicating with an external computer or the like. The timing signal or the like may be input from the outside of the imaging system, and the imaging system may include at least the imaging device 70 and the signal processing unit 708 for processing the imaging signal output from the imaging device 70.

In the present embodiment, the imaging device 70 and the AD conversion unit are provided on different semiconductor substrates, but the imaging device 70 and the AD conversion unit may be formed on the same semiconductor substrate. The imaging device 70 and the signal processing unit 708 may be formed on the same semiconductor substrate.

Further, each pixel may also include a plurality of photoelectric conversion elements. The signal processing unit 708 may be configured to process the pixel signal based on the electric charge generated in the first photoelectric conversion element and the pixel signal based on the electric charge generated in the second photoelectric conversion element, and acquire distance information from the imaging device 70 to the object.

Sixth Embodiment

Figure 8A:
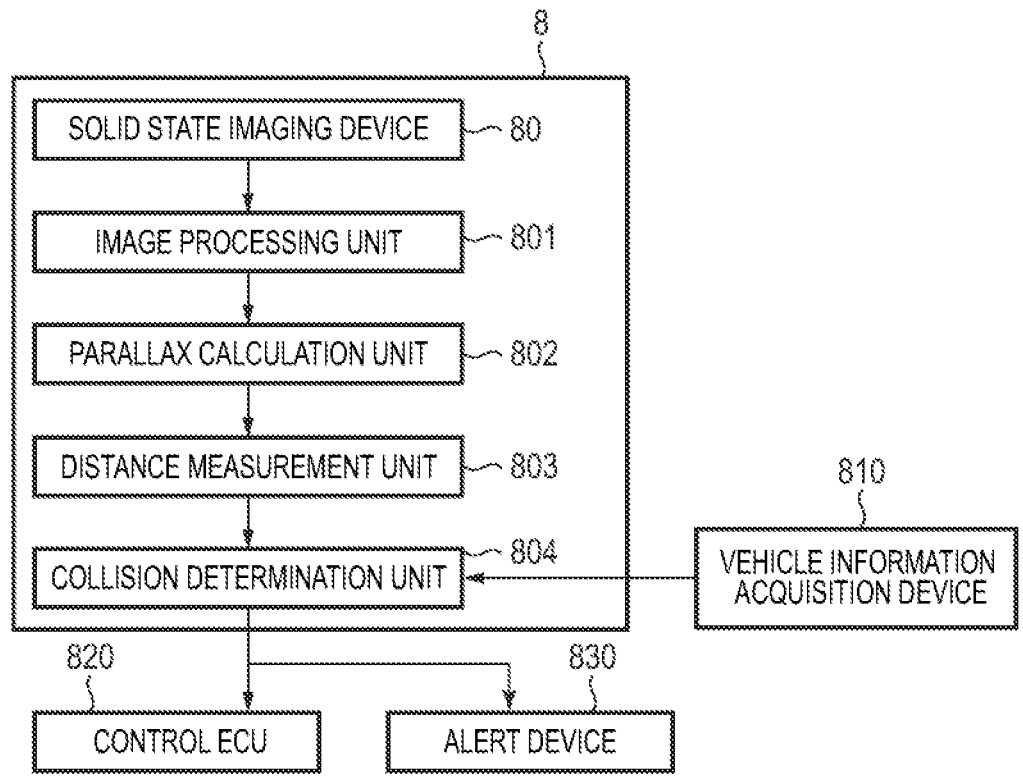
FIG. 8A and FIG. 8B are block diagrams of an imaging system related to an on-vehicle camera according to a sixth embodiment of the present invention.
Figure 8B:
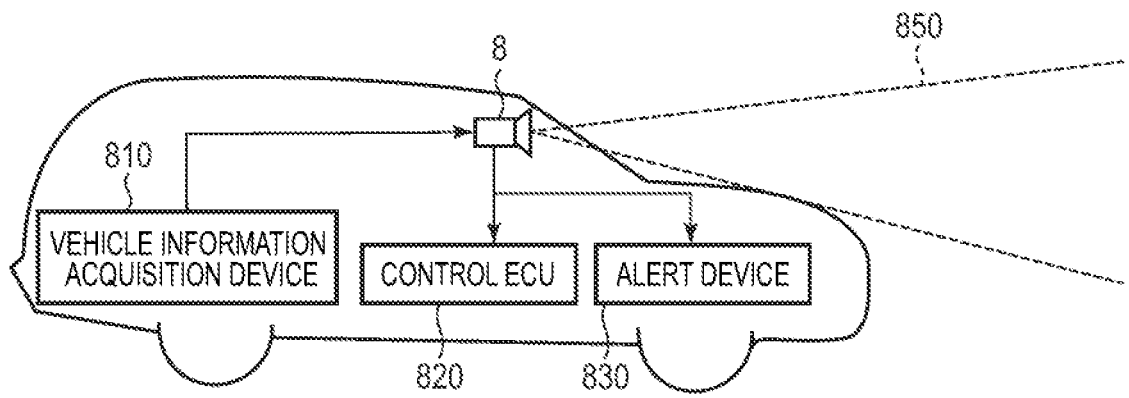

FIG. 8A and FIG. 8B are block diagrams of an imaging system related to an on-vehicle camera according to the present embodiment. An imaging system 8 has an imaging device 80 in the above-described embodiments. The imaging system 8 has an image processing unit 801 that performs image processing on a plurality of image data acquired by the imaging device 80 and a parallax calculation unit 802 that calculates a parallax (a phase difference of parallax images) from the plurality of image data acquired by the imaging system 8. Further, the imaging system 8 has a distance measurement unit 803 that calculates a distance to the object based on the calculated parallax and a collision determination unit 804 that determines whether or not there is a collision possibility based on the calculated distance. Herein, the parallax calculation unit 802 and the distance measurement unit 803 are an example of a distance information acquisition unit that acquires distance information on the distance to the object. That is, the distance information is information on a parallax, a defocus amount, a distance to an object, or the like. The collision determination unit 804 may use any of the distance information to determine the collision possibility. The distance information acquisition unit may be implemented by dedicatedly designed hardware unit or may be implemented by a software module. Further, the distance information acquisition unit may be implemented by a field programmable gate array (FPGA), an application specific integrated circuit (ASIC), or the like or may be implemented by a combination thereof.

The imaging system 8 is connected to the vehicle information acquisition device 810 and can acquire vehicle information such as a vehicle speed, a yaw rate, a steering angle, or the like. Further, the imaging system 8 is connected to a control ECU 820, which is a control device that outputs a control signal for causing a vehicle to generate braking force based on a determination result by the collision determination unit 804. Further, the imaging system 8 is also connected to an alert device 830 that issues an alert to the driver based on a determination result by the collision determination unit 804. For example, when the collision probability is high as the determination result of the collision determination unit 804, the control ECU 820 performs vehicle control to avoid a collision or reduce damage by applying a brake, pushing back an accelerator, suppressing engine power, or the like. The alert device 830 alerts a user by sounding an alert such as a sound, displaying alert information on a display of a car navigation system or the like, providing vibration to a seat belt or a steering wheel, or the like. The imaging system 8 functions as a control means for controlling the operation of controlling the vehicle as described above.

In the present embodiment, an area around a vehicle, for example, a front area or a rear area is captured by using the imaging system 8. FIG. 8B illustrates the configuration of the imaging system when a front area of a vehicle (a capturing area 850) is captured. The vehicle information acquisition device 810 as the imaging control means transmits an instruction to the imaging system 8 or the imaging device 80 so as to perform the operations described in the above-described first to fifth embodiments. With this configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a moving body (moving apparatus) such as a ship, an airplane, an artificial satellite, an industrial robot and a consumer robot, for example. In addition, the imaging system can be widely applied to a device which utilizes object recognition or biosensing such as an intelligent transportation system (ITS) or monitor system, without being limited to moving bodies.

Modified Embodiment

The present disclosure is not limited to the above embodiment, and various modifications can be made. For example, an example in which a part of the configuration of any one of the embodiments is added to another embodiment, or an example in which a part of the configuration of another embodiment is replaced is also an embodiment of the present disclosure.

For example, in the embodiments described above, wiring patterns or bonding pads are provided on the top and bottom of the pixel array, but may be provided only on the top or bottom. That is, the wiring pattern may be connected only to one end of the plurality of voltage supply lines.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present invention, it is possible to provide an imaging device, an imaging system, and a control method of the imaging device, which can stably add time information to image data when photographing a moving image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-085603, filed May 15, 2020, which is hereby incorporated by reference herein in its entirety.

What is claimed is:

1. An imaging device comprising:
a first semiconductor substrate that includes a pixel array having a plurality of pixels arranged in a first direction and a second direction; and
a second semiconductor substrate that includes a signal processing circuit processing a pixel signal from the pixel array,
wherein the first semiconductor substrate comprises:
a plurality of signal lines, each of the plurality of the signal lines being connected to the plurality of pixels in the first direction;
an aperture pixel region that is arranged in the pixel array and that includes a part of the plurality of pixels outputting the pixel signal corresponding to an incident light to the plurality of the signal lines;
a light-shielded pixel region that includes another part of the plurality of pixels which are light-shielded, and that is arranged in the pixel array in the second direction with respect to the aperture pixel region;
a plurality of voltage supply lines that supply a reference voltage with the plurality of pixels arranged in the first direction respectively;
a plurality of first voltage supply portions that are connected to both ends of the plurality of voltage supply lines in the aperture pixel region, and to which the reference voltage from the second semiconductor substrate is supplied; and
a plurality of second voltage supply portions that are connected to both ends of the plurality of voltage supply lines in the light-shielded pixel region, and to which the reference voltage from the second semiconductor substrate is supplied, the plurality of second voltage supply portions being separated from the plurality of first voltage supply portions,
wherein the plurality of first voltage supply portions comprises a first wiring pattern extending in the second direction and connected to the plurality of voltage supply lines in the aperture pixel region; and a first substrate connecting portion connected to the first wiring pattern and the second semiconductor substrate,
wherein the plurality of second voltage supply portions comprises a second wiring pattern extending in the second direction and connected to the plurality of voltage supply lines in the light-shielded pixel region;

and a second substrate connecting portion connected to the second wiring pattern and the second semiconductor substrate, and wherein the second semiconductor substrate comprises a third substrate connecting portion connected to the first substrate connecting portion and a fourth substrate connecting portion connected to the second substrate connecting portion.

2. The imaging device according to claim 1, wherein the second semiconductor substrate comprises:
a third wiring pattern connected to the third substrate connecting portion; and
a fourth wiring pattern connected to the fourth substrate connecting portion.

3. The imaging device according to claim 2,
wherein the third wiring pattern is connected to the fourth wiring pattern, and
wherein the third wiring pattern and the fourth wiring pattern share a bonding pad to which the reference voltage from outside of the second semiconductor substrate is supplied.

4. The imaging device according to claim 2,
wherein a gap is formed between the third wiring pattern and the fourth wiring pattern,
wherein the third wiring pattern is connected to a third bonding pad to which the reference voltage from outside of the second semiconductor substrate is supplied, and
wherein the fourth wiring pattern is connected to a fourth bonding pad to which the reference voltage from outside of the second semiconductor substrate is supplied.

5. The imaging device according to claim 1, wherein the second semiconductor substrate includes a clip circuit limiting the pixel signal in the plurality of the signal lines.

6. The imaging device according to claim 5, wherein the reference voltage is voltage suppled to the clip circuit.

7. The imaging device according to claim 1, wherein the reference voltage is power source voltage or ground voltage.

8. The imaging device according to claim 1, further comprising another light-shielded pixel region including the plurality of light-shielded pixels and arranged in the first direction with respect to the aperture pixel region.

9. The imaging device according claim 1, wherein the plurality of first voltage supply portions are isolated with each other and the plurality of second voltage supply portions are isolated with each other.

10. The imaging device according claim 1, wherein a pair of first wiring patterns is connected to both ends of the plurality of voltage supply lines in the aperture pixel region, and a pair of second wiring patterns is connected to both ends of the plurality of voltage supply lines in the light-shielded pixel region.

11. An imaging system comprising:
the imaging device according to claim 1; and
a signal processing unit that processes an image signal output from the imaging device.

12. The imaging system according to claim 11,
wherein the pixel array includes a plurality of photoelectric conversion units, and
wherein the signal processing unit processes the image signal generated in the plurality of photoelectric conversion units respectively and acquires distance information from the imaging device to an object.

13. An imaging device comprising:
a first semiconductor substrate that includes a pixel array having a plurality of pixels arranged in a first direction and a second direction; and a second semiconductor substrate that includes a signal processing circuit processing a pixel signal from the pixel array, wherein the first semiconductor substrate comprises:
a plurality of signal lines, each of the plurality of the signal lines being connected to the plurality of pixels in the first direction;
an aperture pixel region that is arranged in the pixel array and that includes a part of the plurality of pixels outputting the pixel signal corresponding to an incident light to the plurality of the signal lines;
a light-shielded pixel region that includes another part of the plurality of pixels which are light-shielded, and that is arranged in the pixel array in the second direction with respect to the aperture pixel region;
a plurality of voltage supply lines that supply a reference voltage with the plurality of pixels arranged in the first direction respectively;
a plurality of first voltage supply portions that are connected to both ends of the plurality of voltage supply lines in the aperture pixel region, and to which the reference voltage from the second semiconductor substrate is supplied; and
a plurality of second voltage supply portions that are connected to both ends of the plurality of voltage supply lines in the light-shielded pixel region, and to which the reference voltage from the second semiconductor substrate is supplied, the plurality of second voltage supply portions being separated from the plurality of first voltage supply portions,
wherein a voltage value of the reference voltage supplied from a first end of a first voltage supply line of the plurality of voltage supply lines via a first voltage supply portion of the plurality of first voltage supply portions is approximately equal to the voltage value of the reference voltage supplied from a second end of the first voltage supply line of the plurality of voltage supply lines via the a second voltage supply portion of the plurality of first voltage supply portions.

14. The imaging device according claim 13, wherein the plurality of first voltage supply portions comprises:
a first wiring pattern extending in the second direction and connected to the plurality of voltage supply lines in the aperture pixel region; and
a first substrate connecting portion connected to the first wiring pattern and the second semiconductor substrate, and wherein the plurality of second voltage supply portions comprises:
a second wiring pattern extending in the second direction and connected to the plurality of voltage supply lines in the light-shielded pixel region; and
a second substrate connecting portion connected to the second wiring pattern and the second semiconductor substrate.

15. The imaging device according to claim 14, wherein the second semiconductor substrate comprises:
a third substrate connecting portion connected to the first substrate connecting portion;
a third wiring pattern connected to the third substrate connecting portion;
a fourth substrate connecting portion connected to the second substrate connecting portion; and
a fourth wiring pattern connected to the fourth substrate connecting portion.

16. The imaging device according to claim 15,
wherein the third wiring pattern is connected to the fourth wiring pattern, and
wherein the third wiring pattern and the fourth wiring pattern share a bonding pad to which the reference voltage from outside of the second semiconductor substrate is supplied.

17. The imaging device according to claim 15,
wherein a gap is formed between the third wiring pattern and the fourth wiring pattern,
wherein the third wiring pattern is connected to a third bonding pad to which the reference voltage from outside of the second semiconductor substrate is supplied, and
wherein the fourth wiring pattern is connected to a fourth bonding pad to which the reference voltage from outside of the second semiconductor substrate is supplied.

18. The imaging device according claim 14, wherein a pair of first wiring patterns is connected to both ends of the plurality of voltage supply lines in the aperture pixel region, and a pair of second wiring patterns is connected to both ends of the plurality of voltage supply lines in the light-shielded pixel region.

19. The imaging device according to claim 13, wherein the second semiconductor substrate includes a clip circuit limiting the pixel signal in the plurality of the signal lines.

20. The imaging device according to claim 19, wherein the reference voltage is voltage suppled to the clip circuit.

21. The imaging device according to claim 13, wherein the reference voltage is power source voltage or ground voltage.

22. The imaging device according to claim 13, further comprising another light-shielded pixel region including the plurality of light-shielded pixels and arranged in the first direction with respect to the aperture pixel region.

23. The imaging device according claim 13, wherein the plurality of first voltage supply portions are isolated with each other and the plurality of second voltage supply portions are isolated with each other.

24. The imaging device according claim 13, wherein the voltage value of the reference voltage supplied from an end of a voltage supply line of the plurality of voltage supply lines via a second voltage supply portion of the plurality of second voltage supply portions is approximately equal to the voltage value of the reference voltage supplied from the other end of the voltage supply line of the plurality of voltage supply lines via the other second voltage supply portion of the plurality of second voltage supply portions.

25. An imaging system comprising:
the imaging device according to claim 13; and
a signal processing unit that processes an image signal output from the imaging device.

26. The imaging system according to claim 25,
wherein the pixel array includes a plurality of photoelectric conversion units, and
wherein the signal processing unit processes the image signal generated in the plurality of photoelectric conversion units respectively and acquires distance information from the imaging device to an object.

* * * * *